US 8,239,182 B2

(12) United States Patent
Kanade

(10) Patent No.: US 8,239,182 B2
(45) Date of Patent: Aug. 7, 2012

(54) DATA TRANSMISSION SYSTEM-ON-CHIP MEMORY MODEL BASED VALIDATION

(75) Inventor: Ravindra K. Kanade, Austin, TX (US)

(73) Assignee: Spansion LLC, Sunnyvale, CA (US)

( * ) Notice: Subject to any disclaimer, the term of this patent is extended or adjusted under 35 U.S.C. 154(b) by 593 days.

(21) Appl. No.: 11/950,006

(22) Filed: Dec. 4, 2007

(65) Prior Publication Data
US 2009/0144045 A1 Jun. 4, 2009

(51) Int. Cl.
*G06F 17/50* (2006.01)
*G06F 9/455* (2006.01)
*G06G 7/62* (2006.01)

(52) U.S. Cl. ............ 703/14; 703/13; 716/100; 716/106; 716/110; 716/111; 716/138

(58) Field of Classification Search ............... 703/13, 703/14; 716/1, 5, 100, 106, 110, 111, 138
See application file for complete search history.

(56) References Cited

U.S. PATENT DOCUMENTS

| | | | | |
|---|---|---|---|---|
| 4,744,084 A | * | 5/1988 | Beck et al. | 714/33 |
| 4,862,347 A | * | 8/1989 | Rudy | 703/14 |
| 5,133,062 A | * | 7/1992 | Joshi et al. | 703/13 |
| 5,551,013 A | * | 8/1996 | Beausoleil et al. | 703/23 |
| 5,623,418 A | * | 4/1997 | Rostoker et al. | 716/1 |
| 6,567,957 B1 | * | 5/2003 | Chang et al. | 716/4 |

OTHER PUBLICATIONS

"Array mapping in behavioral synthesis" International Symposium on Systems Synthesis. Cannes, France. 1995.*
"Three Dimensional Integrated Circuits and the Future of System-on-Chip Designs", Patti, Robert S. Proceedings of the IEEE, vol. 94, No. 6, Jun. 2006.*

* cited by examiner

*Primary Examiner* — Kandasamy Thangavelu
*Assistant Examiner* — Nithya Janakiraman
(74) *Attorney, Agent, or Firm* — Turocy & Watson, LLP

(57) ABSTRACT

Systems and/or methods that facilitate simulation, verification, and optimization of a data transmission system by utilizing simulation memory component(s) are presented. A simulation memory component can be used to replace memory components and/or hardware components to facilitate early simulation and/or verification of the overall interconnectivity of the system. A simulation memory component(s) can be configured to emulate various sizes of memory components associated with the system. Data throughput can be measured during simulation, and the depth and/or width associated with a simulation memory component can be adjusted to facilitate obtaining a desired data throughput based in part on predefined data throughput criteria.

20 Claims, 11 Drawing Sheets

DATA TRANSMISSION SYSTEM-ON-CHIP MEMORY MODEL BASED VALIDATION

TECHNICAL FIELD

The subject innovation relates generally to memory systems and in particular, to systems and/or methodologies that can facilitate expedient transmission of data to memory devices.

BACKGROUND

System-on-chip (SOC) designs refer to integrating components of a computer or other electronic system into a single integrated circuit (IC) chip. SOC designs can include digital, analog, mixed-signal hardware components. For example, an SOC can contain one or more processors, one or more timing components such as an oscillator, and/or one or more memory components such as read only memory (ROM), random access memory (RAM), erasable programmable read only memory (EPROM), and/or flash memory. In addition, SOC designs can be utilized in many electronic devices, such as cellular phones, smart cards, personal digital assistants (PDAs), electronic games, electronic organizers, thumb drives, as well as a multitude of other electronic devices.

SOC designs can be developed using various intellectual property (IP) components from various vendors in the industry, which can be memory components (flash memory, RAM, ROM, etc.) and/or other types of hardware components (e.g., processors, timing components, clock generators, etc.). In addition, designers of an SOC system can design their own IP components or blocks (e.g., memory components and/or hardware components). Software drivers can also be developed to control the memory components and/or hardware components contained in an SOC design, for example.

One of the steps in developing an SOC design is that of verification and/or modeling. Verification can involve simulating an SOC design to determine its logical correctness and its compliance to the specification before it is sent to a chip foundry, wherein a foundry can be a semiconductor manufacturer that fabricates semiconductor chips. Modeling can involve simulating an SOC design with various scenarios to improve design cost and/or performance. Hardware description languages (HDLs), such as Verilog and VHSIC (Very High Speed Integrated Circuit) Hardware Description Language (VHDL), as well as other languages (e.g., verification and/or descriptive languages) such as SystemVerilog, SystemC and Vera, can be used for such simulation and verification, for example.

SOC designs have become more complex over the years due to, in part, the ability to fit more memory components and hardware components into a single chip and because tools have been developed that can handle the inherent complexities associated with the more complex designs (e.g., SOC designs) regarding the simulation and verification of the designs. In particular, the verification (e.g., determining the logical correctness of a design) of an SOC design has become very complex and time consuming because of the number and complexity of hardware components that can be associated with an SOC design. For example, up to and even more than 70% of the time and energy associated with creating an SOC design can be spent on verification because of, in part, the increased complexity of SOC designs.

During the development of an SOC design, various hardware components can be developed and/or finished at different stages of the design (e.g., staggered development). However, this staggered development of hardware components can create difficulties in overall SOC verification. Specifically, it is often necessary to compile all of the memory components and/or hardware components associated with an SOC design to verify overall system interconnectivity. Thus, it is often times difficult to test an SOC design without the hardware components that are not completed or that have not been received from an IP component vendor for a particular SOC design. In addition, it can be difficult to determine what size of memory component is optimal for a particular design (e.g., particularly during the early stages of a design).

Therefore, it is desirable to be able to perform simulation and verification on, at least in part, an SOC design while one or more of the hardware components associated with the design are not available to be inserted (e.g., instantiated) and be able to insert one or more different size memory models in place of a memory component into an SOC design, particularly during the early stages of the design process. Being able to test an SOC design prior to possessing all of the completed hardware components and use different size memory models in place of one or more memory components associated with the SOC design can result in higher productivity and/or lower design cost because verification and/or optimization can be performed earlier in a design process, thus enabling one to debug problems with the design and/or optimize the design earlier in the design process.

SUMMARY

The following presents a simplified summary of the innovation in order to provide a basic understanding of some aspects described herein. This summary is not an extensive overview of the disclosed subject matter. It is intended to neither identify key or critical elements of the disclosed subject matter nor delineate the scope of the subject innovation. Its sole purpose is to present some concepts of the disclosed subject matter in a simplified form as a prelude to the more detailed description that is presented later.

The disclosed subject matter relates to systems and/or methods that can facilitate the simulation and verification of system-on-chip (SOC) designs. In particular, the disclosed subject matter relates to systems and/or methods that can facilitate the verification and/or optimization of SOC designs while memory components and/or hardware components associated with an SOC design are not yet available (e.g., prior to delivery of vendor intellectual property (IP) components associated with the SOC design) at the verification stage of an SOC design. In accordance with another aspect of the disclosed subject matter, the disclosed subject matter relates to utilizing simulation memory components to determine an optimum or desired throughput associated with a particular memory and/or hardware component (e.g., flash memory, mask-programmed read-only memory (ROM), programmable ROM (PROM), Erasable PROM (EPROM), UltraViolet (UV)-erase EPROM, one-time programmable ROM, electrically erasable PROM (EEPROM), random access memory (RAM), static random access memory (SRAM), dynamic random access memory (DRAM) etc.) and/or a First-In-First-Out (FIFO) memory component associated with an SOC design. It is to be appreciated that that a simulation memory component can also be used in place of memory components and/or hardware components that are available to be instantiated in a design (e.g., to determine an optimum or desired throughput associated with a particular memory component and/or hardware component).

It is to be appreciated that that the simulation and verification of individual memory components and/or hardware components can be performed upon the completion of each component (e.g., unit-level tests); however, with regard to system-level tests, it can be desired that all of the memory components and/or hardware components associated with the SOC design be completed or nearly completed for verification of the overall system-level design (e.g., the SOC design). The disclosed subject matter provides the ability to test overall system designs without the requirement of all of the memory components and/or hardware components being completed or available. In accordance with one aspect of the disclosed subject matter, a simulation memory component can be instantiated in place of one or more memory components (e.g., flash memory, ROM, RAM, etc.) associated with an SOC design. The disclosed subject matter can facilitate reducing the amount of time that is required to verify and/or optimize an SOC design, such as, for example, an SOC design for a mass storage controller, by providing the ability to start system level tests prior to the completion of all of such hardware components.

In accordance with one aspect of the disclosed subject matter, a simulation memory component can be a memory model used to facilitate simulation of a design. The simulation memory component can be written in a hardware description language (HDL), such as, for example, Verilog and VHSIC (Very High Speed Integrated Circuit) Hardware Description Language (VHDL). The simulation memory component can also be a memory model written in other languages (e.g., verification and/or descriptive languages) such as, for example, SystemVerilog, SystemC and Vera. In accordance with one aspect of the disclosed subject matter, the simulation memory component can be parameterized thus allowing the simulation memory component to be configurable. For example, the simulation memory component can have the data width and memory depth of the simulation memory component can be parameters that can be changed relatively easily. The data width can represent the bit width (e.g., the number of bits) of a particular simulation memory component is and the memory depth can represent the number of individual memory locations a simulation memory component can have, for example. For instance, the data width parameter of the simulation memory component can be, for example, set to 8, 16, 32, 64, 128, or more bits wide. Also, the memory depth parameter of a simulation memory component can be set to 1024, 2048, 16, 384, or more words deep, for example. It is to be appreciated that the disclosed subject matter contemplates the ability to set a data width and memory depth for a simulation memory component to virtually any desired size.

Since SOC designs can have a large number of memory components and/or hardware components contained within them, the use of simulation memory components can be used to achieve a higher level of verification during earlier stages of SOC design development by connecting and instantiating a simulation memory component in place of one or more memory components and/or hardware components. The simulation memory components can facilitate mimicking the actual functionality of memory components associated with an SOC design. For example, the data width and memory depth parameters of a simulation memory component can be set equal to the width and depth of a memory component associated with an SOC design. The associated SOC design can be compiled and verification can begin using the simulation memory component that can be less complex than the memory component it replaces, for example. In addition, various size simulation memory components can replace a memory component to determine the optimal size memory to use in a design. As a result, an earlier simulation and verification of the SOC design can be facilitated by using simulation memory component(s) to replace hardware components that can be unavailable and/or using various size memory simulation components to determine an optimum size memory component to use in a design.

In accordance with one aspect of the disclosed subject matter, a simulation memory component can also be used to facilitate replacing unavailable hardware components associated with an SOC design as well (e.g., components that are not memory). For example, a simulation memory component can be instantiated in place of an unavailable hardware component wherein the simulation memory component can mimic register locations within an unavailable hardware component. It is to be appreciated that the registers located within hardware components can be memory-mapped, wherein the registers of a hardware component associated with an SOC design can be accessed (e.g., read, written, erased, etc.) as if the register addresses are memory addresses located within a memory component (e.g., flash memory, ROM, RAM, etc.).

The following description and the annexed drawings set forth in detail certain illustrative aspects of the disclosed subject matter. These aspects are indicative, however, of but a few of the various ways in which the principles of the innovation may be employed and the disclosed subject matter is intended to include all such aspects and their equivalents. Other advantages and distinctive features of the disclosed subject matter will become apparent from the following detailed description of the innovation when considered in conjunction with the drawings.

DETAILED DESCRIPTION

Figure 1:
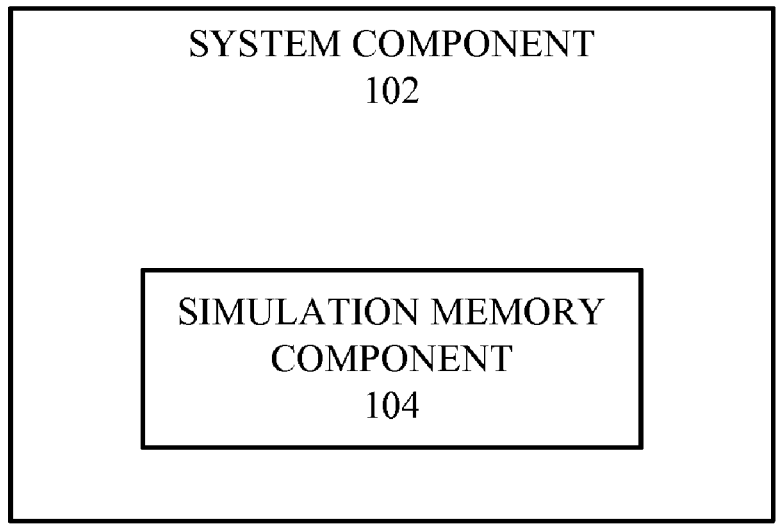
FIG. 1 illustrates a block diagram of a data transmission system that facilitates the verification of a system in accordance with an aspect of the subject matter disclosed herein.

The disclosed subject matter is described with reference to the drawings, wherein like reference numerals are used to refer to like elements throughout. In the following description, for purposes of explanation, numerous specific details are set forth in order to provide a thorough understanding of the subject innovation. It may be evident, however, that the disclosed subject matter may be practiced without these specific details. In other instances, well-known structures and devices are shown in block diagram form in order to facilitate describing the subject innovation.

Conventionally, system-on-chip (SOC) or system designs can have verification performed on them when all associated hardware components are available for instantiation within the system. Verification can involve simulating and testing a system design to see if it functionally performs as intended. Therefore, system connectivity, such as, for example, the connection of the various hardware components associated with a design to the system bus, can often times not be carried-out until near the end of a design process (e.g., when all or substantially all of the memory components and/or hardware components are completed or received from an intellectual property (IP) vendor). In addition, it also can be difficult to verify the optimum size of memory components (e.g., flash memory, random-access memory (RAM), erasable programmable read-only memory (EPROM), first-in first-out (FIFO) memory etc.) to use within a system during the early stages of a design because the effect of size of memory on performance and/or design cost may not be known at the earlier stages of a design process.

The disclosed subject matter can provide the ability to perform verification on and/or optimization of a system design without having all of the hardware components associated with a system available. The disclosed specification describes a configurable simulation memory component that can be instantiated in place of hardware components that, for example, may not be available at the early stages of a design process, where the introduction of a simulation memory component into a system design to "fill-in" a missing or incomplete hardware components can allow for earlier simulation and verification of a system design. Further, simulation memory components can also be used to "fill-in" memory components using simulation memory components of various data widths and memory depths to determine an optimum size memory to use in a design. By enabling an earlier verification of a design at a system-level, the overall system interconnectivity of the system, for example, can be tested earlier than other conventional integrated circuit (IC) design processes. For example, the interface connections of the hardware components to the system bus can be tested prior to having all of the associated hardware component(s) available by instantiating simulation memory component(s) in the place of any missing or incomplete hardware component(s) within the design.

In addition, the overall verification and design process can also be performed earlier by utilizing a simulation memory component within a system design to test various size memory components associated with a design. In accordance with one aspect of the disclosed subject matter, simulation memory components can be configured to emulate various size memory components to facilitate determining an optimal design (e.g., size) for memory components that can be used within a system. The optimum size of a memory component associated with a particular system can be determined based in part on a desired throughput for a given memory component, for example. It is to be appreciated that throughput from a given memory component can vary based in part on the data width and/or the memory depth of the memory component. In accordance with one aspect of the disclosed subject matter, a simulation memory component can be configured and simulated using different data widths and/or memory depths associated with the simulation memory component in order to determine a desired (e.g., optimal) data width and/or memory depth to facilitate construction of a memory component associated with the system that can attain a desired data throughput. The early determination of desired respective sizes (e.g., data width and/or memory depth) of various memory components associated with a particular system can facilitate a quicker design process by avoiding the design of memory components that do not provide an adequate data throughput, for example.

Turning to the figures, FIG. 1 illustrates a system 100 that facilitates the verification of a data transmission system, in accordance with an aspect of the subject matter. System 100 can include a system component 102 that can represent an SOC or system design, for example. In accordance with one aspect of the disclosed subject matter, the system component 102 can represent a data transmission system for different types of electronic devices such as, for example, cellular phones, smart cards, personal digital assistants (PDAs), electronic games, electronic organizers, as well as a multitude of other electronic devices. In another aspect, the system component 102 can represent a controller for a mass storage device such as, for example, thumb drives or smart cards.

Often times, it can be difficult to perform verification of a system design because one or more hardware components associated with the system design are not available to be instantiated (e.g., particularly at the early stages of a design). There can be many reasons why one or more hardware components are not ready for instantiation at a particular stage of a development of a system design (e.g., system component 102). One reason, for example, can be that the design of a particular component is not yet completed, thus not allowing the component to be instantiated within the system design. Another reason, for example, can be that one or more hardware components associated with the system design (e.g., system component 102) have not yet been delivered by an intellectual property (IP) vendor. Without all of the hardware components associated with the system component 102 ready for instantiation, it can be difficult to perform system-level simulation and verification of the system component 102 as a whole.

The system component 102 can include a simulation memory component 104. The simulation memory component 104 can be installed and/or instantiated in place of one or more memory components and/or hardware components associated with the system component 102 to facilitate verification of components in or associated with the system component 102 and/or optimization of the design of one or more components in or associated with the system component 102. For example, the simulation memory component 104 can be instantiated in place of a memory component(s) and/or a hardware component(s) that is not yet ready to be instantiated for a system-level simulation and verification within the system component 102. It is to be appreciated that the disclosed specification contemplates that the simulation memory component 104 can be instantiated in place of completed and available memory components as well, for example, to facilitate data throughput analysis as discussed, for example, infra in system 400.

In accordance with one aspect of the disclosed subject matter, the simulation memory component 104 can be a configurable memory model that can be written in a hardware description language (HDL) such as, for example, Verilog and VHSIC (Very High Speed Integrated Circuit) Hardware Description Language (VHDL). In another aspect, the simulation memory component 104 can be a configurable memory written in verification and/or descriptive languages such as, for example, System Verilog, SystemC or Vera. It is to be appreciated that the disclosed specification contemplates that the simulation memory component 104 can be designed using a different HDL or other software languages as well.

In accordance with one aspect of the disclosed specification, the simulation memory component 104 can be a configurable memory model that can be instantiated in place of a memory component associated with the system component 102. For example, the simulation memory component 104 can be instantiated in place of a flash memory (not shown), while in another aspect, the simulation memory component 104 can be instantiated in place of a read-only memory (ROM) (not shown) or random-access memory (RAM) (not shown), for example. In accordance with one aspect of the disclosed subject matter, the simulation memory component 104 can be instantiated in place of a memory component (e.g., in place of a missing or incomplete memory component) associated with system component 102, wherein the simulation memory component 104 can mimic or emulate the memory component. For example, the simulation memory component 104 can function in the same or substantially the same manner as the memory component in which the simulation memory component 104 is meant to replace for verification and/or design optimization (e.g., to determine an optimum size memory to use in a design).

In accordance with another aspect of the disclosed subject matter, a simulation memory component 104 can also be used to facilitate replacing other hardware components associated within the system component 102 as well (e.g., hardware components that are not necessarily memory). For example, the simulation memory component 104 can be instantiated in place of a general purpose input and output (GPIO) component (not shown) associated with the system component 102. In another example, the simulation memory component 104 can be instantiated in place of an incomplete serial peripheral interface (SPI) component (not shown) associated with the system component 102.

Often times, the hardware components associated with a particular design (e.g., system component 102) can have registers associated with them, wherein registers can be storage locations used to store control and status information associated with the hardware component (e.g., configuration and status registers) associated with the design. In accordance with one aspect of the disclosed subject matter, the simulation memory component 104 can be instantiated in place of an unavailable hardware component wherein the simulation memory component 104 can mimic the register locations associated within the hardware component the simulation memory component 104 is meant to replace. It is to be appreciated that the registers located within hardware components can be memory-mapped, wherein the registers can be accessed (e.g., read, written, erased etc.) in the same manner as if the register addresses are memory addresses located within a memory component (e.g., flash memory, ROM, RAM, etc.) associated with system component 102, for example.

One of the advantages of compiling a simulation memory component 104 in place of a memory component or other type of hardware component within system component 102 is that it can allow for system-level testing and verification of system component 102 earlier in a design process. For example, the connectivity of a common bus (e.g., that can connect components associated with system component 102) can be verified at an earlier stage in the design process, as compared to conventional systems, by instantiating the simulation memory component 104 in place of components that are not available for instantiation with the system component 102.

The earlier system verification of a design (e.g., system component 102) can allow for earlier detection and correction of bugs associated with the interconnectivity of components within a design, for example. In addition, the verification of the system component 102 with an instantiated simulation memory component 104 can be less complicated, because the simulation memory component 104 can be less complex than the hardware component the simulation memory component 104 is meant to replace for simulation/verification purposes. Further, the simulation and verification of a system design (e.g., system component 102) can be performed more quickly because the simulation memory component 104 can be less complex than the memory component or hardware component the simulation memory component 104 is meant to replace (e.g., less processor time is required to simulate a less complex design). Further, a smaller simulation memory component (e.g., a smaller memory depth) than the memory component with which the simulation memory component can replace can be used during simulation and/or verification of a system design which can also reduce the amount of time required to simulate and verify a design (e.g., a simulator can swap a smaller amount of memory during the simulation when a smaller simulation memory component is used). The simulation and/or verification time can be shorter because it can require less computations (e.g., processor time) to simulate and/or verify a less complex design (e.g., a design that incorporates the use of a simulation memory component 104).

Figure 2:
FIG. 2 depicts a block diagram of a system that facilitates the creation of a simulation memory component in accordance with an aspect of the disclosed subject matter.
Figure 2:
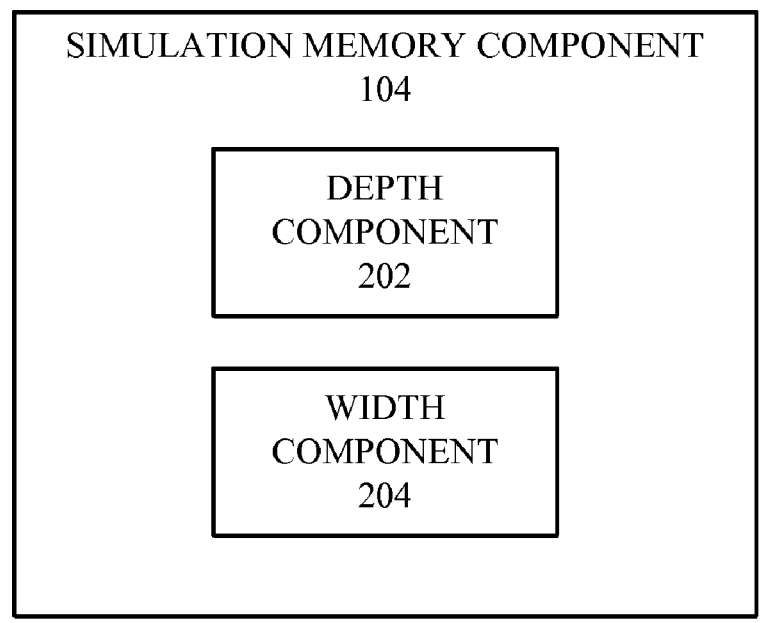

Referring to FIG. 2, depicted is a system 200 that depicts a data transmission system, in accordance with an aspect of the disclosed subject matter. System 200 can include a simulation memory component 104 that can have the same or substantially the same functionality as described supra in system 100. The simulation memory component 104 can be, for example, a memory model written in a HDL (e.g., Verilog, VHDL), a verification or descriptive language (e.g., SystemVerilog, SystemC, Vera) or other software language (e.g., C, C++, Java).

In one embodiment of the disclosed specification, the simulation memory component 104 can contain a depth component 202 and a width component 204 wherein the width component 204 and depth component 202 can respectively represent a data width and memory depth of a simulation memory component 104. The depth component 202 and width component 204 can be, for example, parameters (e.g., variables) within the HDL or software code describing the simulation memory component 104.

In one aspect, depth component 202 and width component 204 associated with the simulation memory component 104 can be parameters at the top of a Verilog model that the simulation memory component 104 can be written in, for example. The depth component 202 and width component 204 parameters can, for example, be changed for different size memory requirements. A width component 204 (e.g., represented by a parameter), for example, can determine the number of bits that can be associated with a particular simulation memory component 104. Also, a depth component 202 (e.g., represented by a parameter) can, for example, determine how the number of individual memory locations that can be associated with a particular simulation memory component 104.

For instance, the width component 204 of a simulation memory component 104 can be set to 16 bits while the depth component 202 can be set to 1024 (e.g., the number of addresses that can be associated with the simulation memory component 104). Setting the width component 204 to 16 bits and the depth component 202 to 1024 can, for example, provide a simulation memory component 104 that contains 2048 bytes of information. It is to be appreciated that the disclosed subject matter contemplates the ability to set the depth component 202 and the width component 204 to virtually any desired size to accommodate virtually all potential size memory components that can be associated with a particular design.

Figure 3:
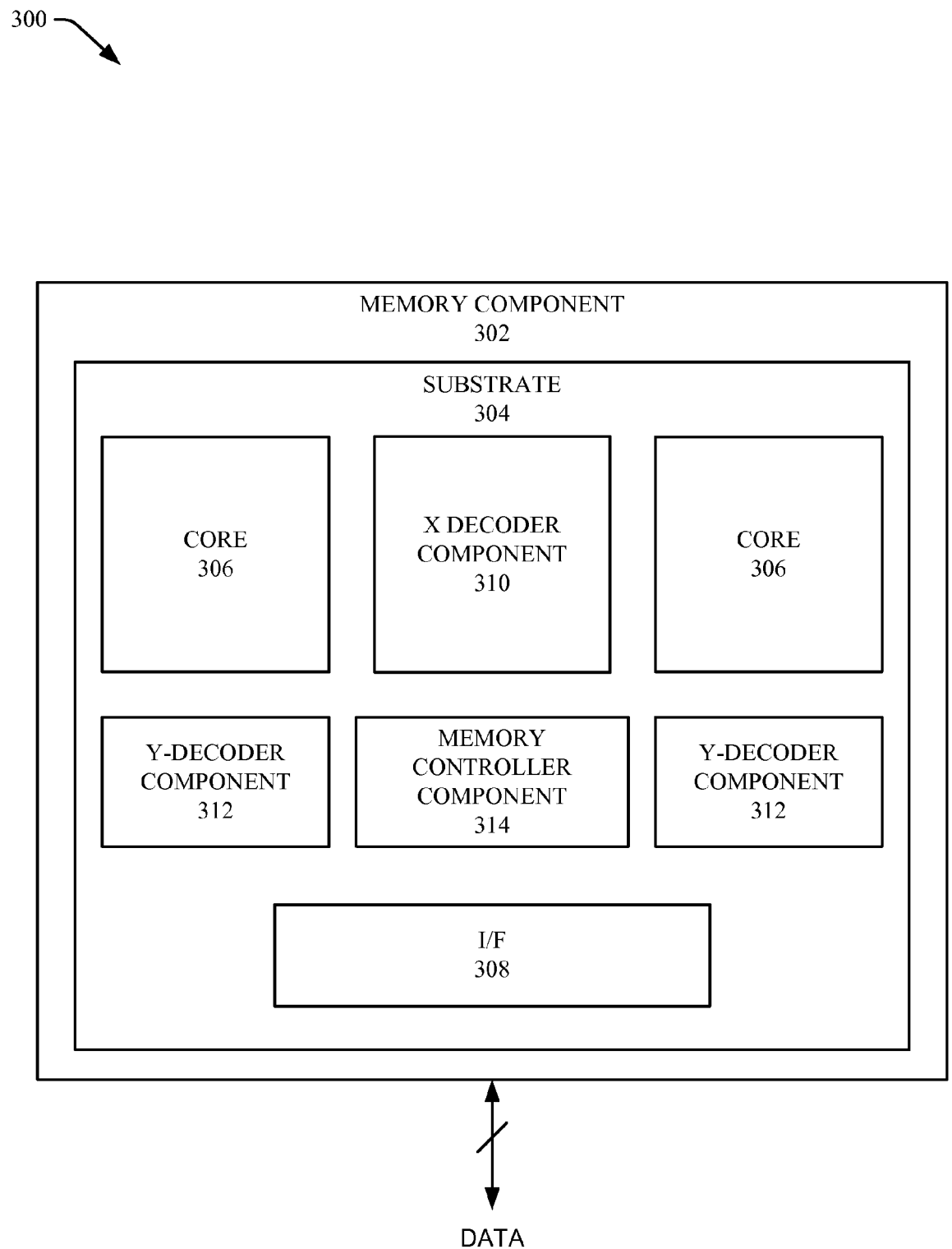
FIG. 3 illustrates a block diagram of a system that depicts an example memory component in which a simulation memory component can emulate in accordance with an aspect of the subject matter disclosed herein.

Turning to FIG. 3, illustrated is a block diagram of a system 300 that can represent a memory component that a simulation memory component (e.g., simulation memory component 104 of FIG. 1) can replace for verification and/or optimization in accordance with the disclosed subject matter. Often times, various size memory components (e.g., memory components with different data widths and/or memory depths), such as, for example, the memory component 302 depicted in system 300 are not available for system verification at certain stages of a design (e.g., particular at the early stages of a design) to determine an optimum size memory component to use in a design. Alternatively, a simulation memory component (e.g., 104) can be simulated in place of memory component 302 to facilitate the reduction of the complexity and time that can be required for verification and/or optimization of a system design. In such cases, a simulation memory component (e.g., simulation memory component 104 of system 100 or system 200) can be connected within a system component (e.g., system component 102 of system 100) in place of the memory component 302, for example.

It is to be appreciated that even though an actual design of a memory component 302 can, for example, be of various degrees of complexity, a simulation memory component can be created to perform the same or similar functionality as the memory component 302 even though the simulation memory component 104 can be much less complex than the memory component 302. The reduction in complexity can allow for a reduced verification run-time period as well as can make it easier to debug system-level issues because of the removal of complex components from a system (e.g., system component 102 of FIG. 1). Further, a smaller simulation memory component (e.g., a smaller memory depth) than the memory component 302 (e.g., to be used in a system design) can be used during simulation and verification of a system design which can also reduce the amount of time required to simulate and verify a the design (e.g., a simulator can swap a smaller amount of memory while executing the simulation when a smaller simulation memory component is used during the simulation).

In accordance with one aspect, the system 300 can be or can include a memory component 302, which can be a flash memory (e.g., single-bit flash memory, multi-bit flash memory), that can be created on a semiconductor substrate 304 in which one or more core regions 306, which can be higher-density core regions, and one or more peripheral regions, which can be lower-density regions, can be formed. The high-density core regions 306 can include one or more M by N arrays of individually addressable, substantially identical multi-bit memory cells (not shown). The memory cells in memory component 302 can retain stored data even while disconnected from a power source. The memory cells, for example, can be the memory locations that a simulation memory component (e.g., simulation memory component 104 of FIG. 1) can emulate to store data during the simulation and/or verification of a design (e.g., system component 102 of FIG. 1).

The lower-density peripheral regions can typically include an interface component 308 (hereinafter also referred to as "I/F 308") and programming circuitry for selectively addressing the individual memory cells. The programming circuitry can be represented in part by and can include one or more x-decoders 310 and one or more y-decoders 312 that can cooperate with the I/F 308 for selectively connecting a source, gate, and/or drain of selected addressed memory cells to predetermined voltages or impedances to effect designated operations (e.g., programming, reading, erasing) on the respective memory cells, and deriving necessary voltages to effect such operations. Further, the I/F 308 can include and/or provide various adapters, connectors, channels, communication paths, etc. to integrate the system 300 into virtually any operating and/or database system(s) and/or with another system(s). In addition, I/F 308 can provide various adapters, connectors, channels, communication paths, etc., that can provide for interaction and/or communication with other components, data, and the like, associated with the system 300.

System 300 can also include a memory controller component 314 that can facilitate control of the flow of data to and from the memory component 302. In one aspect, the memory controller component 314 can facilitate execution of operations (e.g., read, write, erase) associated with memory locations in the core(s) 306. In another aspect, the memory controller component 314 can facilitate verifying and/or maintaining the desired charge level(s) associated with data stored in the memory locations in the core(s) 306.

Figure 4:
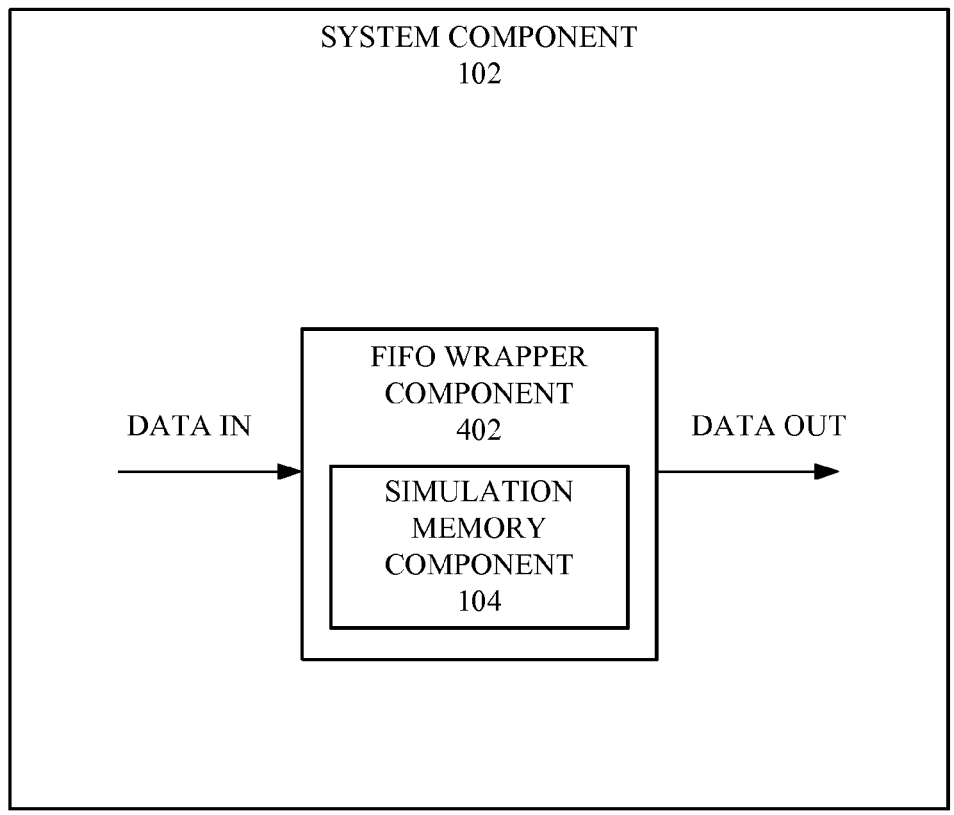
FIG. 4 illustrates a block diagram of a data transmission system in which a simulation memory component can be used for verification in accordance with an embodiment of the disclosed subject matter.

Referring to FIG. 4 illustrates a block diagram of a system 400 in which a simulation memory component can be employed for verification of components associated with a data transmission system in accordance with an embodiment of the disclosed subject matter. In accordance with one aspect, the system 400 can be or can include a system component 102, wherein the system component 102 can have the same functionality or substantially the same functionality as described herein, for example, with regard to system 100. In one embodiment, a simulation memory component 104 can be instantiated in place of a first-in-first-out (FIFO) memory that can be associated with a system component 102. To mimic or represent the functionality of a FIFO, a FIFO wrapper component 402 can be created and used as a wrapper around the simulation memory component 104, for example. The FIFO wrapper component 402 can include such functionality as, for example, incrementing and decrementing logic for pointers used for memory address locations within the simulation memory component 104, logic for FIFO overflow indications, and logic for underflow indications. The logic incorporated into the FIFO wrapper component 402 can be standard logic as used in industry to conform a memory or memory model (e.g., simulation memory component 104) into a simulation model with FIFO functionality/characteristics, for example.

In accordance with one aspect of the disclosed subject matter, the simulation memory component 104 can be written in various computer related languages (e.g., Verilog, VHDL, C++, SystemC etc.) and can have parameters associated the data width and memory depth of the simulation memory component 104, for example, as discussed herein with regard to system 200. The configurable memory model (e.g., simulation memory component 104) can facilitate easily adjusting the memory depth (e.g., depth component 202 in FIG. 2) and the data width (e.g., width component 204 in FIG. 2) enabling one to simulate a system component 102 using different size FIFOs (e.g., a FIFO wrapper component 402 associated with a simulation memory component 104, hereinafter also collectively referred to as a "simulation FIFO") by adjusting the associated memory depth and data width associated with the simulation memory component 104.

An advantage to performing simulation and verification on system component 102 using the simulation FIFO is that throughput measurements can be taken using different data widths and different memory depths associated with the simulation memory component 104. Conventionally, designers can perform system analysis on a system prior to having a memory available for simulation or verification within a design, which can lead to choosing a memory that can be either too small or too large for a particular design. However, the use of the FIFO wrapper component 402 associated with the simulation memory component 104 can facilitate choosing the right size FIFO or other memory associated with system component 102, because actual data throughput measurements can be performed after simply changing the data width (e.g., width component 204 of FIG. 2) and/or memory depth (e.g., depth component 202 of FIG. 2) associated with simulation memory component 104 to facilitate a desired (e.g., optimal) design and performance of a FIFO (e.g., based in part on the simulation associated with the FIFO wrapper component 402) and/or a memory component 302 (e.g., based in part on the simulation associated with the simulation memory component 104), as opposed to guessing what throughput values will be or using calculations to predict data throughput that can be based in part on guessing design variables associated with a particular design.

Figure 5:
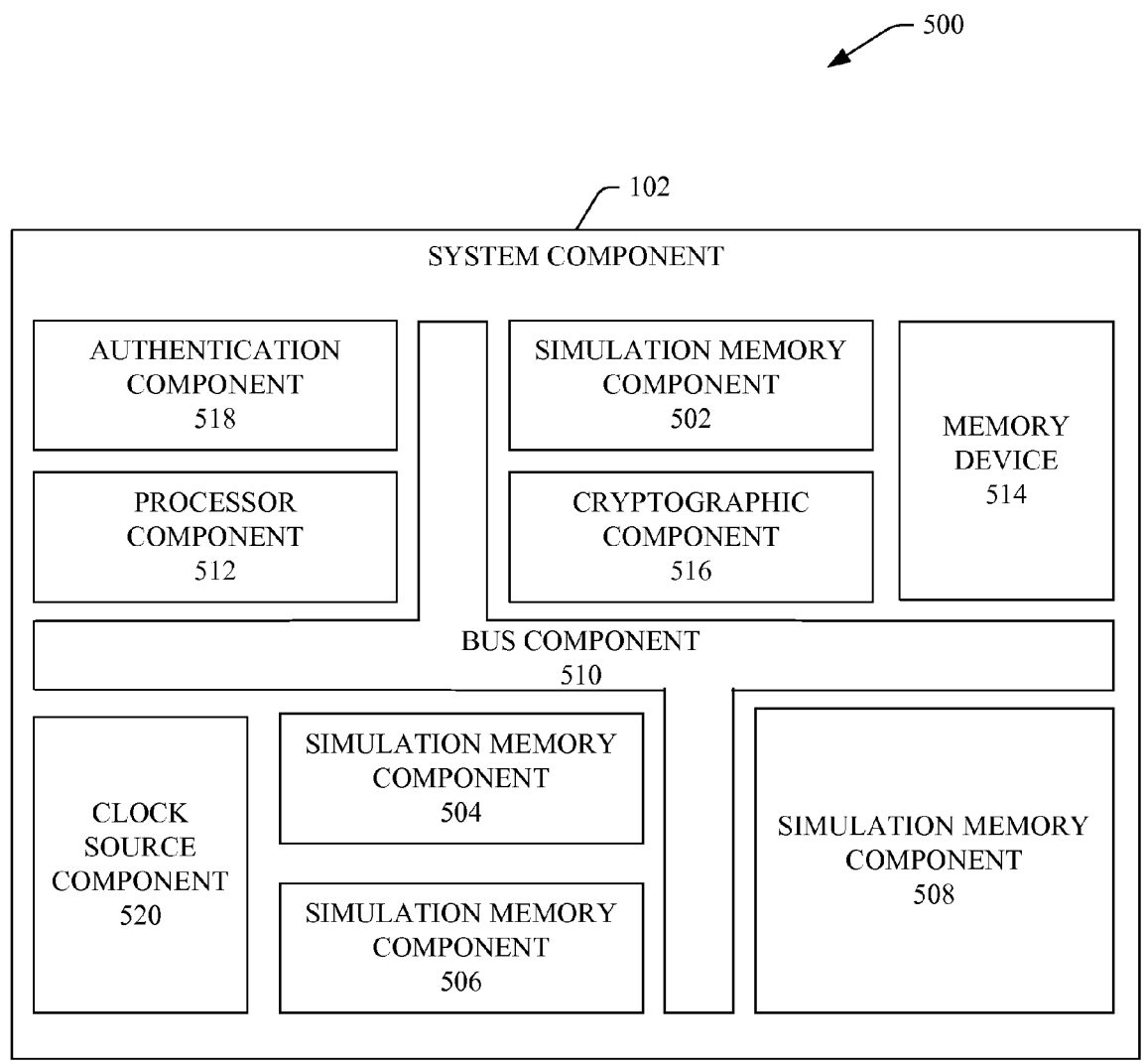
FIG. 5 depicts an example diagram of a data transmission system that facilitates utilizing a simulation memory component within a system component in accordance with the disclosed subject matter.

Referring to FIG. 5 illustrates a block diagram of a system 500 that depicts simulation memory components incorporated into a data transmission system in accordance with an aspect of the disclosed subject matter. In accordance with an embodiment of the disclosed subject matter, system 500 can include a system component 102, wherein the system component 102 can represent a system-level design (e.g., an SOC design) that can include one or more memory components and/or hardware components associated with the system component 102. For example, in one embodiment, the system component 102 can be associated with simulation memory component 502, simulation memory component 504, simulation memory component 506, simulation memory component 508 (hereinafter also collectively referred to as "simulation memory components 502 through 508") (e.g., where none, one, or more than one of such simulation memory components 502 through 508 can be associated with a FIFO wrapper component, such as FIFO wrapper component 402, as illustrated in FIG. 4 and described herein, as desired). It is to be appreciated that the simulation memory components 502 through 508 can be memory models (e.g., simulation memory component 104 of FIG. 1) that can be used to replace actual memory components and/or hardware components associated with system component 102 for the simulation and/or verification of system component 102. For example, one or more of the simulation memory components 502 through 508 can be instantiated within system component 102 and can have the same or similar functionality (e.g., for simulation and verification) as a ROM, RAM, EPROM, flash memory, general purpose input and output (GPIO) components, serial peripheral interface (SPI) components or any other memory component or hardware component that can be associated with system component 102.

In another example, one or more of the simulation memory components 502 through 508 can be used during verification of the system component 102 in place of hardware components associated with system component 102. For example, one or more of the simulation memory components 502 through 508 can be instantiated in place of an unavailable hardware component wherein the one or more of the simulation memory components 502 through 508 can represent register locations within the missing hardware components associated with the system component 102. It is to be appreciated that the registers located within the missing hardware components associated with system component 102 can be memory-mapped the system component 102. The memory-mapping of registers within system component 102 can, for example, facilitate accessing the registers (e.g., control and/or status registers associated with the missing hardware components of a system component 102) as if the registers are memory locations associated with a memory (e.g., flash memory, ROM, RAM, etc.).

One of the advantages to replacing memory components and/or other hardware components associated with system component 102 with one or more of the simulation memory components 502 through 508 is that the time associated with verification and/or optimization of a design can be reduced. For example, the amount of time associated with verification can be reduced because the verification code used to test the system component 102 when the simulation memory components 502 through 508 are instantiated in the system can be the same code used when the hardware components and/or memory components (e.g., the hardware components and/or memory component that the simulation memory components 502 through 508 were used to replace) are placed in the system component 102. For instance, verification code can be written to write data to a register of a hardware component associated with the system component 102. That same code (e.g., without any alteration), can be used when the simulation memory components 502 through 508 are instantiated with the system component 102 and when the memory components and/or hardware components, with which the simulation memory components 502 through 508 initially replaced, are instantiated with the system component 102 for simulation and/or verification of the system component 102.

The bus component 510 can provide a network or electrical interconnect between electric and/or semiconductor components within the system component 102 including, but not limited to, the simulation memory components 502 through 508, a processor component 512, a memory device 514, a cryptographic component 516, an authentication component 518, and/or a clock source component 520, for example. The bus component 510 can be comprised of any of several types of bus structure(s). These types of bus architectures can include, but not limited to, Advanced Microcontroller Bus Architecture (AMBA), AXI Bus, and VME bus. It is to also be appreciated that the bus component 510 can be, for example, associated with such bus architectures as the Extended ISA (EISA), Industrial Standard Architecture (ISA), Micro-Channel Architecture (MSA), VESA Local Bus (VLB), Card Bus, Universal Serial Bus (USB), Advanced Graphics Port (AGP), Personal Computer Memory Card International Association bus (PCMCIA), Firewire (IEEE 1394), Small Computer Systems Interface (SCSI), Intelligent Drive Electronics (IDE), and Peripheral Component Interconnect (PCI).

It is to be appreciated that that, while system 500 is depicted with components, such as, the bus component 510, processor component 512, memory device 514, cryptographic component 516, authentication component 518, clock source component 520, etc., the disclosed subject matter is not so limited and contemplates other hardware components (not shown) that can be associated with system component 102. It is to be further appreciated that the disclosed specification contemplates that some of the hardware components (e.g., bus component 510, processor component 512, memory device 514, cryptographic component 516, authentication component 518, clock source component 520) depicted in system 500 may not be associated with all potential embodiments of system 500, for example.

In accordance with one embodiment of the disclosed subject matter, system 500 can include a processor component 512. The processor component 512 can be a typical applications processor that can manage communications and run applications. For example, processor component 512 can be a processor that can be utilized by a computer, a mobile handset, PDA, or other electronic device. The processor component 512 can generate commands, including read, write, and/or erase commands, in order to facilitate reading data from, writing data to, and/or erasing data from, for example, the simulation memory components 502 through 508, the memory device 514, the cryptographic component 516, the authentication component 518, and/or the clock source component 520, where the communication of information between the processor component 512 and the simulation memory components 502 through 508, the memory device 514, the cryptographic component 516, the authentication component 518, and/or the clock source component 520 can be facilitated via a bus component 514. It is to be appreciated that the processor component 512 can be a stand-alone unit that can be associated with the system component 102, and can generate and execute commands to access data to/from the simulation memory components 502 through 508, the memory device 514, the cryptographic component 516, the authentication component 518, and/or the clock source component 520, for example.

The memory device 514 can include one or more memory locations in which data can be programmed and from which data can be read (or erased). The memory device 514 can comprise nonvolatile memory, such as a flash memory (e.g., single-bit flash memory, multi-bit flash memory), a read-only memory (ROM), mask-programmed ROM, programmable ROM (PROM), Erasable PROM (EPROM), Ultra Violet (UV)-erase EPROM, one-time programmable ROM, and electrically erasable PROM (EEPROM), and/or volatile memory, such as RAM, static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM), for example.

In accordance with yet another aspect of the disclosed subject matter, the processor component 512 can facilitate the encryption and/or decryption by directing data traffic through the cryptographic component 516. The processor component 512 can, for example, direct the results from the cryptographic component 516 to one of the simulation memory components 502 through 508 or the memory device 514, for example. The cryptographic component 516 can include a security engine (not shown) that can be configured to perform cryptographic functions that can facilitate securing data written to, stored in, and/or read from one of the simulation memory components 502 through 508, for example. Cryptographic functions, such as, for instance, encryption, decryption, key generation, and/or hash, to facilitate data security can be employed in conjunction with the processor component 512 and can include use of symmetric and/or asymmetric algorithms, such as Advanced Encryption Standard (AES)—a block symmetric key cipher, Data Encryption Standard (DES), Triple Data Encryption Standard (3DES)—a block cipher form by utilizing the DES cipher at least three times, Secure Hash Algorithm (SHA) and its variants such as, for example, SHA-0, SHA-1, SHA-224, SHA-256, SHA-384, and SHA-512, and the Rivest, Shamir, and Adleman (RSA) encryption algorithm, and the like.

In one embodiment of system component 102, the processor component 512 can, for example, facilitate a signature authentication requirement for entities to access data stored in the one or more of the simulation memory components 502 through 508 or the memory device 514, for example. In applications where such authentication is implemented, system 500 can include an authentication component 518 that can solicit authentication data from the entity, and upon the authentication data so solicited, can be employed, individually and/or in conjunction with information acquired and ascertained as a result of biometric modalities employed, to facilitate control access to data stored in the one or more of the simulation memory components 502 through 508 or the memory device 514, for example. The authentication data can be in the form of a password (e.g., a sequence of humanly cognizable characters), a pass phrase (e.g., a sequence of alphanumeric characters that can be similar to a typical password but is conventionally of greater length and contains non-humanly cognizable characters in addition to humanly cognizable characters), a pass code (e.g., Personal Identification Number (PIN)), and the like, for example.

In still another aspect, the system component 102 can include a clock source component 520 that can provide a clock signal that can be utilized to facilitate the timing of functions that are being performed by respective components (e.g., simulation memory components 502 through 508, bus component 510, processor component 512, memory device 514, cryptographic component 516, authentication component 518) within the system component 102. The clock source component 520 can provide one or more clock frequencies to facilitate synchronized performance of functions by the system component 102 and components therein.

It is to be understood and appreciated that one or more of the components such as, for example, the authentication component 518, cryptographic component 516, and/or the clock source component 520 can be included within the system component 102, as depicted in FIG. 5, or stand-alone units that can be associated with the system component 102, or a combination thereof. It is to be further appreciated that the memory component (e.g., memory device 514), the hardware components (e.g., bus component 510, processor component 512, cryptographic component 516, authentication component 518) and the simulation memory components 502 through 508 depicted in system 500 are illustrated as example components that can be associated with system component 102. It is to be appreciated that the disclosed subject matter envisions and/or contemplates other embodiments wherein one or more of the hardware components depicted in system 500 (e.g., processor component 512, memory device 514, cryptographic component 516, authentication component 518) can also be replaced by one or more simulation memory components (e.g., simulation memory component 104 illustrated in FIG. 1 and described herein) for system-level simulation and/or verification, wherein the simulation memory component can mimic the storage registers (e.g., control and configuration registers) associated with the respective hardware components.

The aforementioned systems have been described with respect to interaction between several components. It should be appreciated that such systems and components can include those components or sub-components specified therein, some of the specified components or sub-components, and/or additional components. Sub-components could also be implemented as components communicatively coupled to other components rather than included within parent components. Further yet, one or more components and/or sub-components may be combined into a single component providing aggregate functionality. The components may also interact with one or more other components not specifically described herein for the sake of brevity, but known by those of skill in the art.

FIGS. 6-9 illustrate methodologies and/or flow diagrams in accordance with the disclosed subject matter. For simplicity of explanation, the methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts may be required to implement the methodologies in accordance with the disclosed subject matter. In addition, those skilled in the art will understand and appreciate that the methodologies could alternatively be represented as a series of interrelated states via a state diagram or events. Additionally, it should be further appreciated that the methodologies disclosed hereinafter and throughout this specification are capable of being stored on an article of manufacture to facilitate transporting and transferring such methodologies to computers. The term article of manufacture, as used herein, is intended to encompass a computer program accessible from any computer-readable device, carrier, or media.

Figure 6:
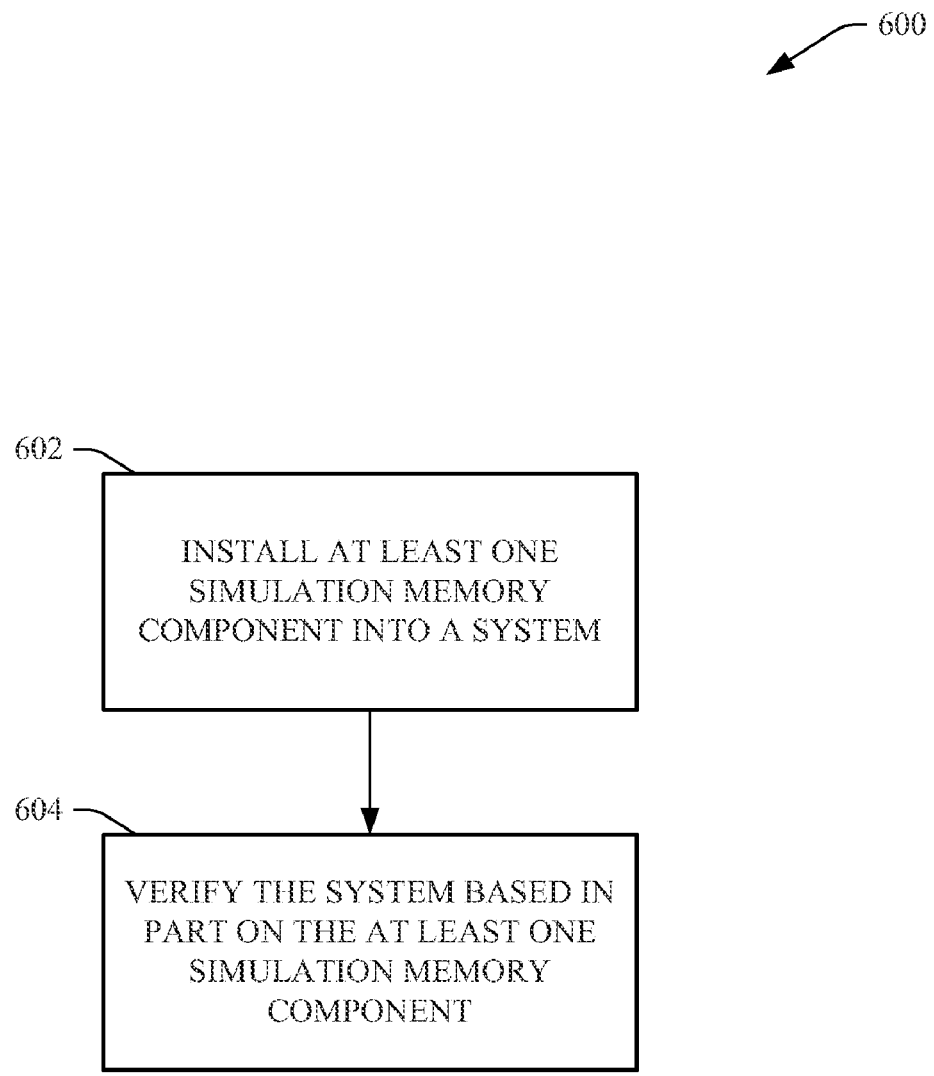
FIG. 6 illustrates a methodology that facilitates verification of a data transmission system in accordance with an aspect of the disclosed subject matter.

Referring to FIG. 6, a methodology 600 that can facilitate verification of a system in accordance with the disclosed subject matter is illustrated. At 602, at least one simulation memory component can be installed into a system. For example, a simulation memory component (e.g., 104 of FIG. 1, 104 of FIG. 2) can be placed within a system (e.g., system component 102 of FIG. 1, system component 102 of FIG. 4, system component 102 of FIG. 5) in place of a memory component and/or a hardware component(s). In accordance with one aspect of the disclosed subject matter, the memory component can be the same or have the same functionality as memory component 302 depicted in system 3, for example. In another aspect, a simulation memory component (e.g., 104 of FIG. 1) can be used for simulation in place of a missing authentication component (e.g., authentication component 518 of FIG. 5), wherein, for instance, the simulation memory component can mimic or emulate the storage registers (e.g., control and configuration registers) associated with the authentication component. The placement of the simulation memory component(s) into the system component can, for example, allow for the system to be compiled, thus allowing the system to be simulated, verified, and/or optimized.

At 604, verification can be performed on the system based in part on the at least one simulation memory component installed in the system. By utilizing the simulation memory component(s) verification of a system (e.g., of system component 102 of FIG. 1, system component 102 of FIG. 5) and the overall system interconnectivity can, for example, be tested earlier than other conventional design processes (e.g., design processes that perform verification at the system level when all or nearly all components associated with a design are complete). For example, the interface connections of the memory components and/or hardware components (e.g., simulation memory components 502 through 508, the memory device 514, the cryptographic component 516, the authentication component 518, and/or the clock source component 520 of FIG. 5) to a system bus (e.g., bus component 514 of FIG. 5) can be simulated and verified prior to having all of the associated hardware components available for instantiation, thus allowing for earlier verification of or part of a system component (e.g., system component 102 of FIG. 1). At this point, methodology 600 can end.

Figure 7:
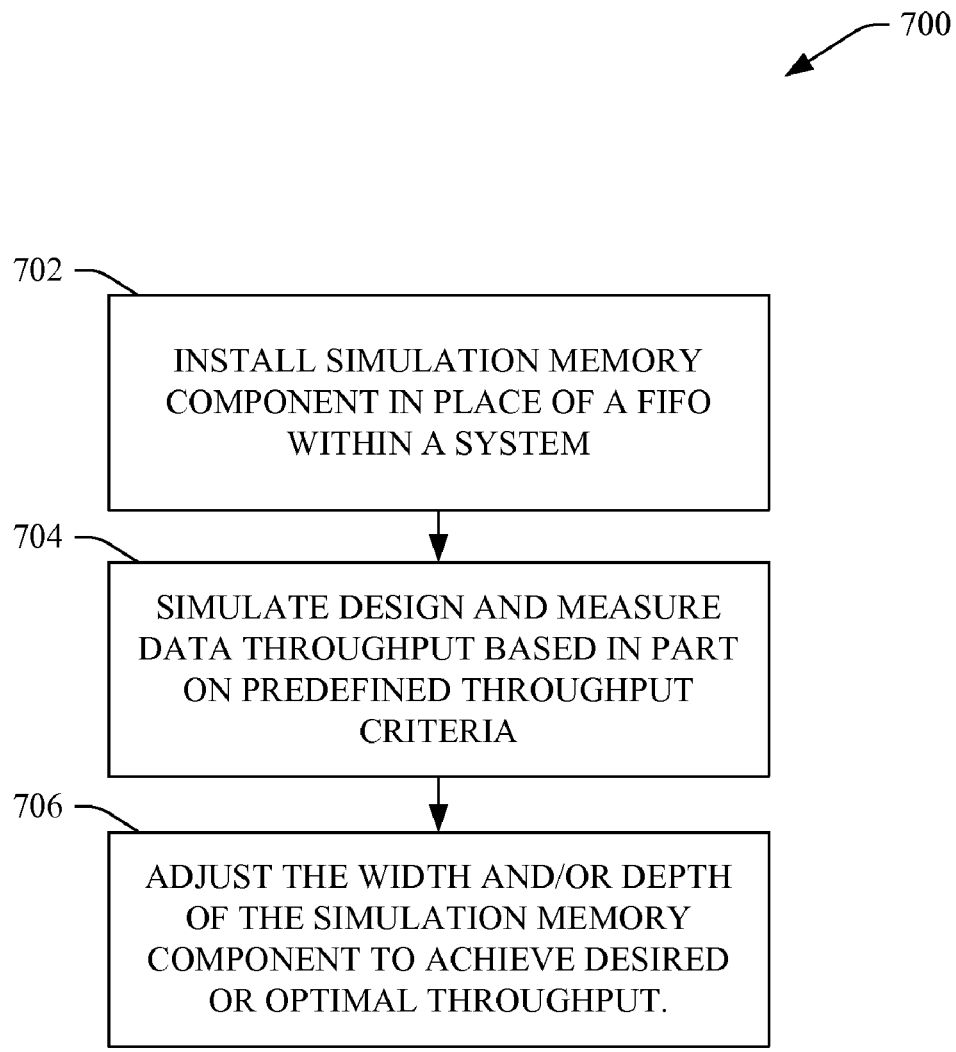
FIG. 7 depicts a methodology that facilitates simulating a system using a simulation memory component in accordance with an aspect of the disclosed subject matter.

Turning to FIG. 7, a methodology 700 that facilitates simulating a system using a simulation memory component in accordance with the disclosed subject matter is illustrated. At 702, a simulation memory component can be installed in place of a FIFO within a system. In accordance with one aspect of the disclosed subject matter, a FIFO wrapper (e.g., FIFO wrapper component 402 depicted in FIG. 3 and described herein) can be installed around a simulation memory component (e.g., simulation memory component 104 of FIG. 1, simulation memory component 104 of FIG. 3) to provide FIFO functionality to the simulation memory component, for example. The FIFO wrapper can include aspects of a FIFO, such as, for instance, incrementing and decrementing logic for pointers to memory locations associated with a FIFO and logic for overflow and overflow indications associated with a FIFO. In accordance with one aspect of the disclosed subject matter, various size simulation memory components (simulation memory component 104 of FIG. 1) and respective FIFO wrapper (e.g., FIFO wrapper component 402) (hereinafter collectively also referred to as a "simulation FIFO") can replace can replace an actual FIFO within a design to determine an optimum size FIFO to use within a design.

In accordance with one aspect of the disclosed subject matter, the simulation FIFO can be used during simulation and verification to reduce the complexity of the design (e.g., by simulating with a smaller size FIFO than the actual FIFO that is going to be used in the design), thus it can reduce the overall time to simulation a design (e.g., a simulator can swap a smaller amount of memory during a simulation when a smaller simulation memory component is used during the simulation), for example. In yet another aspect, the simulation FIFO can be used for simulation and/or verification in order to take advantage of the scalability of the simulation memory component (e.g., simulation memory component 104 of FIG. 4) associated with the simulation FIFO to vary the size of the simulation FIFO, thus allowing the system component to be simulated and verified using simulation FIFOs of different sizes (e.g., FIFO widths and/or FIFO depths), for example.

At 704, the design can be simulated and measurements of data throughput can be taken based in part on predefined throughput criteria. The throughput criteria can be, for example, data throughput requirements for a particular simulation FIFO used in a simulation and/or data throughputs required by the system component as a whole. The predefined throughput criteria can be based in part on desired data throughput at various nodes or key points, respectively, within a design. As further example, the predefined throughput criteria can be related to the data throughput associated with the input and output nodes that can be associated with the simulation FIFO (e.g., the "data in" and "data out" points associated with the FIFO wrapper component 402 of FIG. 4) used within a system component.

At 706, the width and/or depth of the simulation memory component(s) can be controlled (e.g., adjusted) to achieve a desired or optimal throughput. In accordance with one aspect of the disclosed subject matter, if the measurement associated with the throughput of a simulation FIFO (e.g., a simulation memory component 104 of FIG. 4 in conjunction with a FIFO wrapper component 402 of FIG. 4) does not achieve a desired or optimal throughput, then the simulated FIFO dimensions can be adjusted via adjusting the respective width and/or depth of the simulation memory component(s) associated with the simulation FIFO. For example, the depth of the simulation memory component (e.g., simulation memory component 104 of FIG. 4) associated with the simulation FIFO can be increased or decreased (e.g., via an associated depth component 202 as described in FIG. 2) to facilitate an increase or decrease in the depth of the simulation FIFO for a particular simulation. In another example, the width of simulation memory component (e.g., simulation memory component 104 of FIG. 4) can be increased or decreased (e.g., via an associated width component 204 as described in FIG. 2) to facilitate an increase or decrease in the width of the corresponding simulation FIFO for a particular simulation. At this point, methodology 700 can end.

Figure 8:
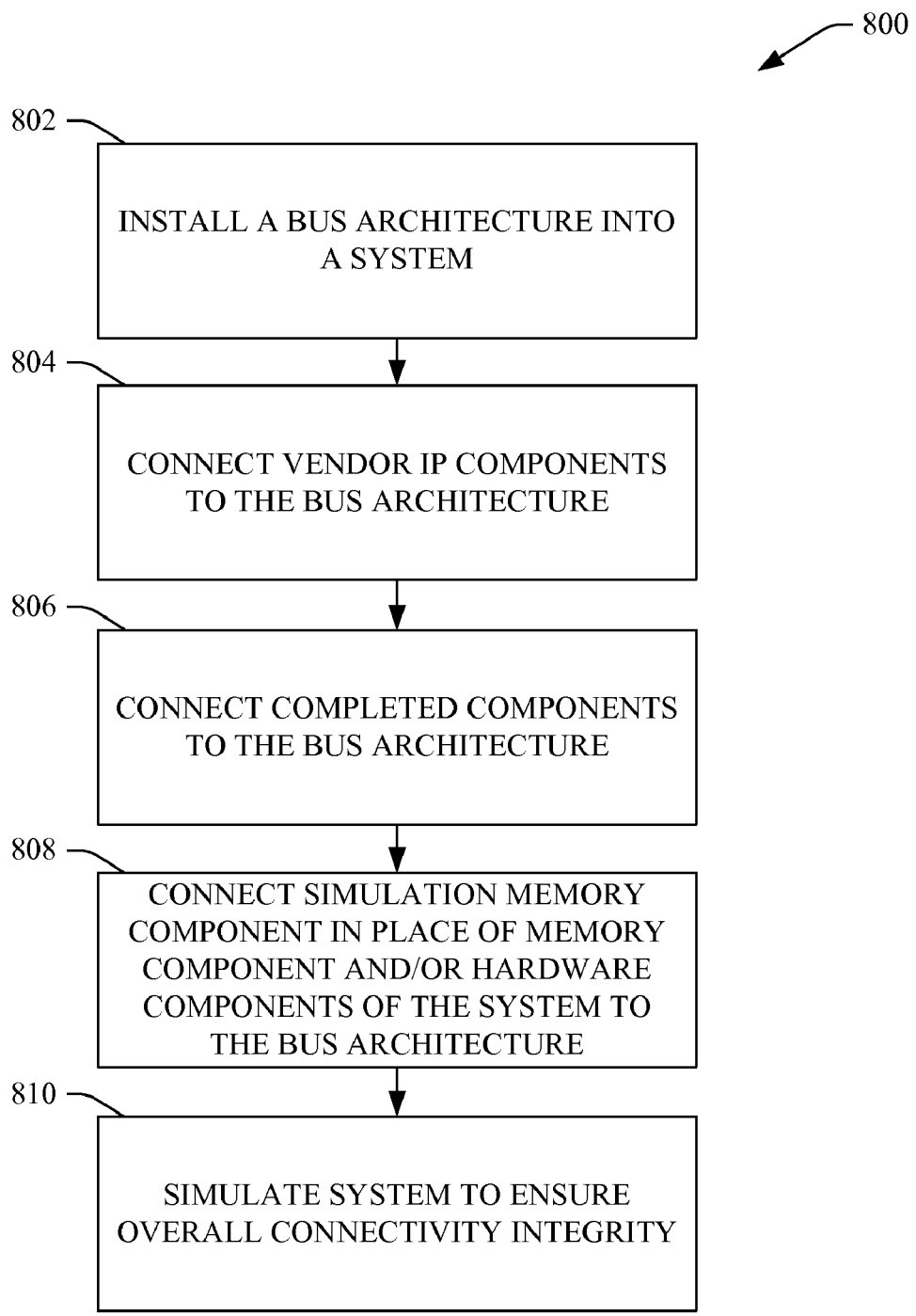
FIG. 8 illustrates a methodology that facilitates utilizing a simulation memory component for simulating and/or verifying a system in accordance with an aspect of the disclosed subject matter.

Referring to FIG. 8, a methodology 800 that can facilitate verification and/or optimization of a system in accordance with an aspect of the disclosed subject matter is illustrated. At 802, a bus architecture can be installed into a system. For example, a bus architecture (e.g., bus component 510 of FIG. 5) can be installed into a system component (e.g., system component 102 of FIG. 5). In one aspect, the bus architecture can provide a way for various components of a system component (e.g., simulation memory components 502 through 508 of FIG. 5, a processor component 512 of FIG. 5, a memory device 514 of FIG. 5, a cryptographic component 516 of FIG. 5, an authentication component 518 of FIG. 5, and/or a clock source component 520 of FIG. 5) to communicate with each other. It is to be appreciated that the bus architecture can be one or more types of bus structure(s). For example, the bus architecture can be a memory bus, a peripheral bus, other type of bus, or any combination thereof.

At 804, vendor intellectual property (IP) components can be connected to the bus architecture associated with the system. In accordance with one aspect of the disclosed subject matter, a cryptographic component (e.g., cryptographic component 506 of FIG. 5) can, for example, be a component that an outside vender (e.g., a third party that can design and deliver IP components) can provide for a system (e.g., system component 102 of FIG. 5). If the vender has supplied the cryptographic component, for example, it can be connected to the bus architecture associate with the system at this point. It is to be appreciated that in some situations, it is possible that no components associated with a system are provided by an outside vendor. It is to be further appreciated that as many as all of the components associated with a particular system can be provided by outside vendors, for example.

At 806, completed components can be connected to the bus associated with the system. In accordance with one aspect of the disclosed subject matter, a memory component (e.g., memory component 302 of FIG. 3) associated with a system (e.g., system component 102 of FIG. 5) can be connected to the bus architecture (e.g., bus component 510 of FIG. 5). In addition, any other completed component (e.g., processor component 512 of FIG. 5, memory device 514 of FIG. 5, cryptographic component 516 of FIG. 5, authentication component 518 of FIG. 5, and/or clock source component 520 of FIG. 5) can also be connected to the bus architecture associated with the system to be simulated/verified.

At 808, simulation memory component(s), which can be utilized in the system for simulation/verification/optimization, can be connected to the bus architecture associated with the system. In one aspect, a simulation memory component (e.g., 104 of FIG. 1, 104 of FIG. 2) can be placed within a system in place of a memory component(s) (e.g., memory device 514 of FIG. 5) and/or hardware component(s) (e.g., cryptographic component 516 of FIG. 5, wherein the simulation memory component can emulate registers associated within the cryptographic component 516), for example. In accordance with an aspect of the disclosed subject matter, the simulation memory component can, for example, be the same or have the same functionality as memory component 302 (e.g., depicted in FIG. 3 and described herein). It is to be appreciated that, the placement of the simulation memory component(s) into the system can allow for the system to be compiled prior to one or more of the components that are associated with a given system being available, and employing such simulation memory component(s) can thus allow the system to be simulated, verified, and/or optimized without one or more of the actual components (e.g., memory components and/or hardware components) available for instantiation.

At 810, the system can be simulated to ensure, for example, the overall connectivity integrity of the design. For example, the interface connections of hardware components (e.g., processor component 512 of FIG. 5, memory device 514 of FIG. 5, cryptographic component 516 of FIG. 5, authentication component 518 of FIG. 5, and/or clock source component 520 of FIG. 5) to the bus architecture (bus component 510 of FIG. 5) can be simulated at this point. For example, simulation memory components 502 through 508 of FIG. 5 can represent such unfinished memory components and/or hardware components during the simulation of the system. At this point, methodology 800 can end.

Figure 9:
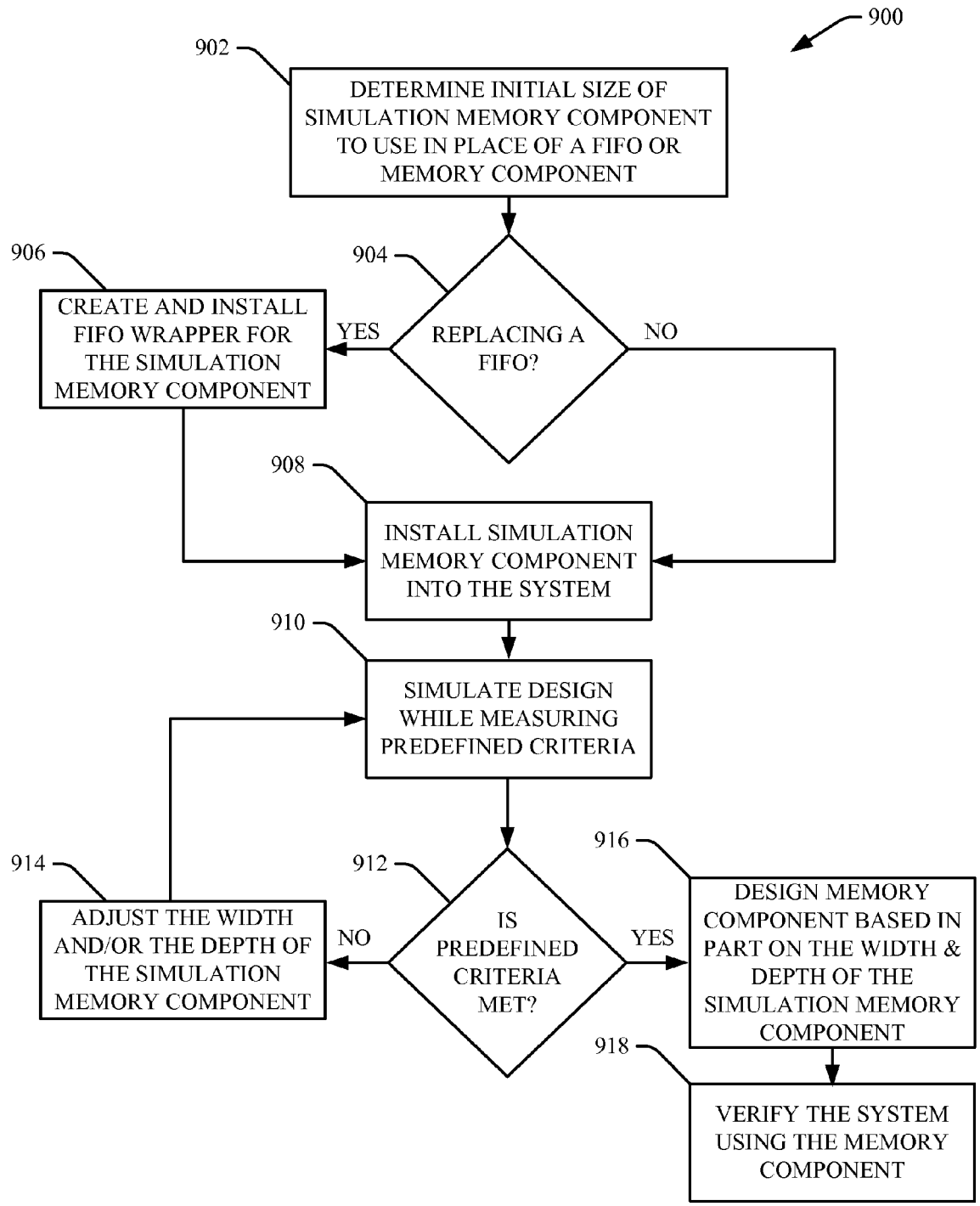
FIG. 9 illustrates a methodology that facilitates utilizing a simulation memory component to determine an optimum size of memory component to use in a system in accordance with an aspect of the disclosed subject matter.

Referring to FIG. 9, a methodology 900 that can facilitate the verification and/or optimization of a system in accordance with the disclosed subject matter is illustrated. At 902, an initial size of a simulation memory component to use in place of a memory component (e.g., memory device 514 of FIG. 5) and/or a FIFO associated with a system can be determined. In accordance with one aspect of the disclosed subject matter, once the initial size of the simulation memory component (e.g., simulation memory component 102 of FIG. 4), the depth of the simulation memory component can be set via a depth parameter (e.g., depth component 202 of FIG. 2) to correspond to the determined depth of the memory component or FIFO, and the data width parameter of the simulation memory component can be set via a width parameter (e.g., width component 204 of FIG. 2) to correspond to the determined width of the FIFO.

At 904, a determination can be made as to whether the simulation memory component is to replace a FIFO in the system component. If the simulation memory component is to replace a FIFO, at 906, a FIFO wrapper can be created for the simulation memory component. The FIFO wrapper can have the same functionality as described herein with reference to the FIFO wrapper component 402 described in system 400. For instance, the FIFO wrapper can be used as a wrapper for the simulation memory component, and the FIFO wrapper can include such functionality as, for example, incrementing and decrementing logic for pointers used for memory address locations within the simulation memory component and logic for FIFO overflow and underflow indications associated with overwriting and underwriting, respectively, a FIFO.

Referring back to reference numeral 904, if, at 904, it is determined that the simulation memory component is not replacing a FIFO in the system component, and/or after a FIFO wrapper is created at reference numeral 906, at 908, the simulation memory component can be installed into the system. In accordance with one aspect of the disclosed subject matter, the simulation memory component can be connected to a bus (e.g., bus component 510 of FIG. 5) associated with the data transmission system, for example.

At 910, the simulation of the design can begin and measurements associated with the simulation memory component(s) can be taken to obtain a desired (e.g., optimal) design of the component(s) that is being simulated by the simulation memory component(s) and/or other components associated with the data transmission system based in part on predefined criteria. In one aspect of the disclosed subject matter, the predefined criteria can relate to a desired data throughput associated with a memory component or FIFO the simulation memory component replaces in the system. The data throughput measurements can, for example, be taken at the input (e.g., "data in" of FIFO wrapper component 402 of FIG. 3) and at the output (e.g., "data out" of FIFO wrapper component 402 of FIG. 3) of the FIFO wrapper if the simulation memory component replaces a FIFO within the system, or data throughput measurements can be taken at an associated input and/or output of the simulation memory component if the simulation memory component replaces a memory component within the system.

In another aspect of the disclosed subject matter, the predefined criteria also can relate to the amount of power that can be consumed by the memory component or FIFO that the simulation memory component replaces within the system (e.g., a faster throughput associated with a memory component and/or FIFO can equate to a higher power usage by the system as a whole). For example, power consumption measurements can be taken with regard to the simulation memory component and/or of the system as a whole during simulation. In another aspect, the predefined criteria can involve the amount of physical area the memory component or FIFO that the simulation memory component replaces within the system can utilize. In yet another aspect, the predefined criteria can relate to timing issues (e.g., data input and data output timing issues that can be related to the size of a memory component and/or a FIFO) related to the memory component or FIFO that the simulation memory component replaces within the system.

It is to be appreciated that the disclosed subject matter is not delimited to only the predefined criteria mentioned herein (e.g., power consumption, data throughput, physical area usage, data input and data output timing) and the disclosed subject matter contemplates that other predefined criteria can be employed, as desired, and used as a basis for determining a desired (e.g., optimal) optimal size for the simulation memory component and thus the proper size memory component or FIFO to use within a system. It is to be further appreciated that some or all of the aforementioned predefined criteria, as well as other criteria, can be employed, as desired, to facilitate determining a desired (e.g., optimal) size of the simulation memory component.

At 912, a determination can be made as to whether the desired throughput (e.g., optimal throughput) was achieved. If it is determined that the predetermined criteria associated with the simulation memory component was not achieved (e.g., the data throughput was too low), at 914, the memory depth and/or data width of the simulation memory component, for example, can be adjusted (e.g., increased or decrease). In accordance with one aspect of the disclosed subject matter, the memory depth of the simulation memory component can be increased by increasing the number of memory locations of the simulation memory component by increasing the a depth parameter (e.g., by varying the depth component 202 of FIG. 2) associated with the simulation memory component, for example. In accordance with another aspect of the disclosed subject matter, the data width of the simulation memory component can be increased, for example, in a manner described in herein, for example, with reference to the width component 204 of FIG. 2. Once, the respective width and depth parameters have been adjusted, methodology 900 can return to reference numeral 910, where the simulation of the design can again be performed and the predetermined criteria can be measured again. This iterative process of adjusting the respective depth and width of the simulation memory component (e.g., at reference numerals 910, 912, and 914 of FIG. 9) can continue until the predetermined criteria (e.g., data throughput, physical size of memory component, power usage, timing requirements) of the simulation memory component and associated memory component or associated FIFO is achieved. It is to be appreciated that one or more predefined criteria can be analyzed and used in the determination of a desired (e.g., optimal) size of the simulation memory component to be utilized in the system to facilitate the desired design of an actual component modeled by the simulation memory component and/or other components in the system.

Referring again to reference numeral 912, if, at 912, it is determined that the desired data throughput associated with the simulation memory component is achieved, at 916, a FIFO or memory component can be designed based in part on the width and depth of the simulation memory component that meet the predefined criteria.

At 918, verification can be performed on the system with the actual FIFO or memory component installed in the system (e.g., data transmission system). At this point, methodology 900 can end.

As utilized herein, terms "component," "system," "interface," and the like, are intended to refer to a computer-related entity, either hardware, software (e.g., in execution), and/or firmware. For example, a component can be a process running on a processor, a processor, an object, an executable, a program, and/or a computer. By way of illustration, both an application running on a server and the server can be a component. One or more components can reside within a process and a component can be localized on one computer and/or distributed between two or more computers.

The disclosed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Additionally it should be appreciated that a carrier wave can be employed to carry computer-readable electronic data such as those used in transmitting and receiving electronic mail or in accessing a network such as the Internet or a local area network (LAN). Of course, those skilled in the art will recognize many modifications may be made to this configuration without departing from the scope or spirit of the disclosed subject matter.

Some portions of the detailed description have been presented in terms of algorithms and/or symbolic representations of operations on data bits within a computer memory. These algorithmic descriptions and/or representations are the means employed by those cognizant in the art to most effectively convey the substance of their work to others equally skilled. An algorithm is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the foregoing discussion, it is appreciated that throughout the disclosed subject matter, discussions utilizing terms such as processing, computing, calculating, determining, and/or displaying, and the like, refer to the action and processes of computer systems, and/or similar consumer and/or industrial electronic devices and/or machines, that manipulate and/or transform data represented as physical (electrical and/or electronic) quantities within the computer's and/or machine's registers and memories into other data similarly represented as physical quantities within the machine and/or computer system memories or registers or other such information storage, transmission and/or display devices.

Figure 10:
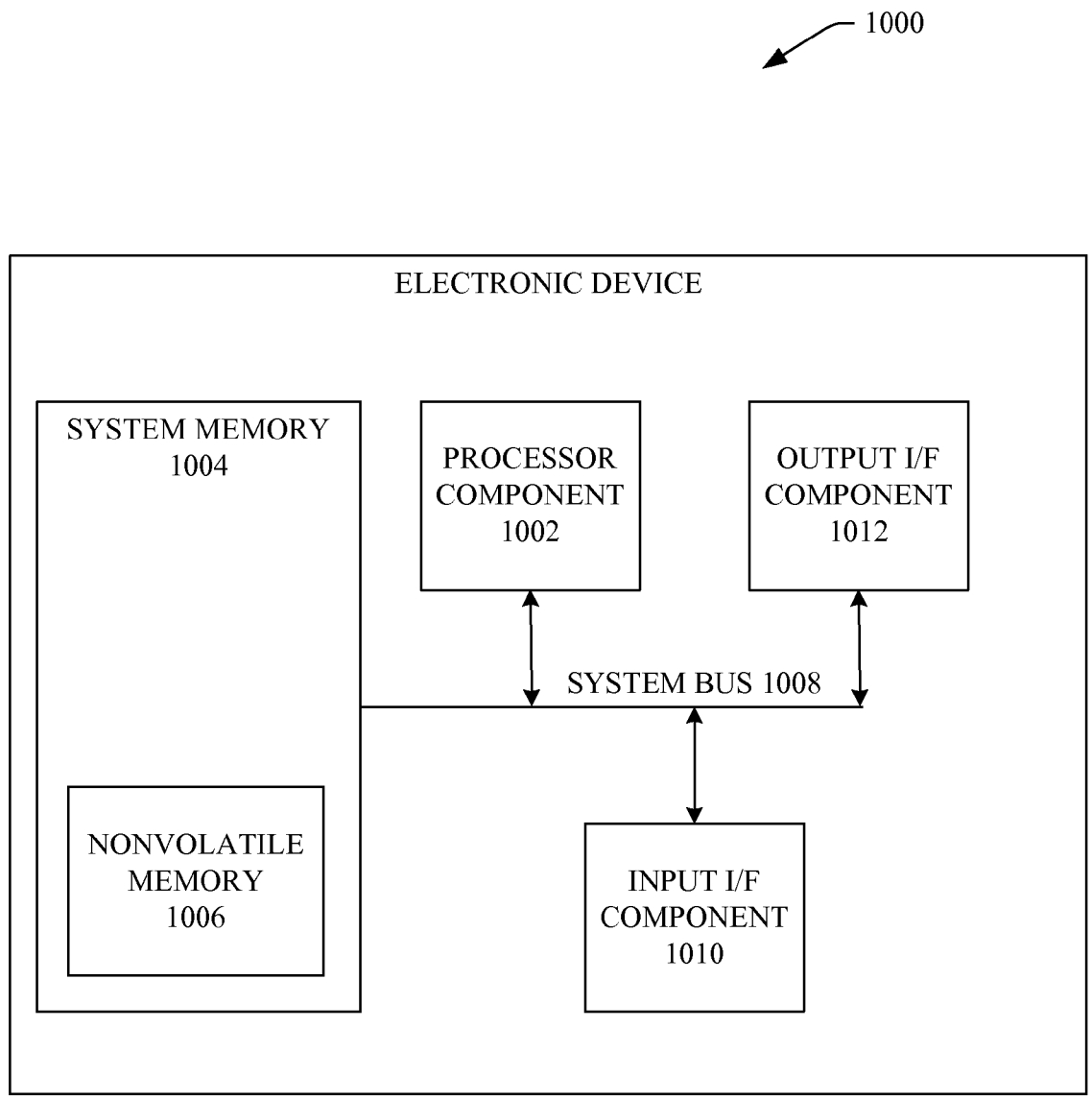
FIG. 10 is a block diagram of an exemplary electronic device that can employ an SOC design.
Figure 11:
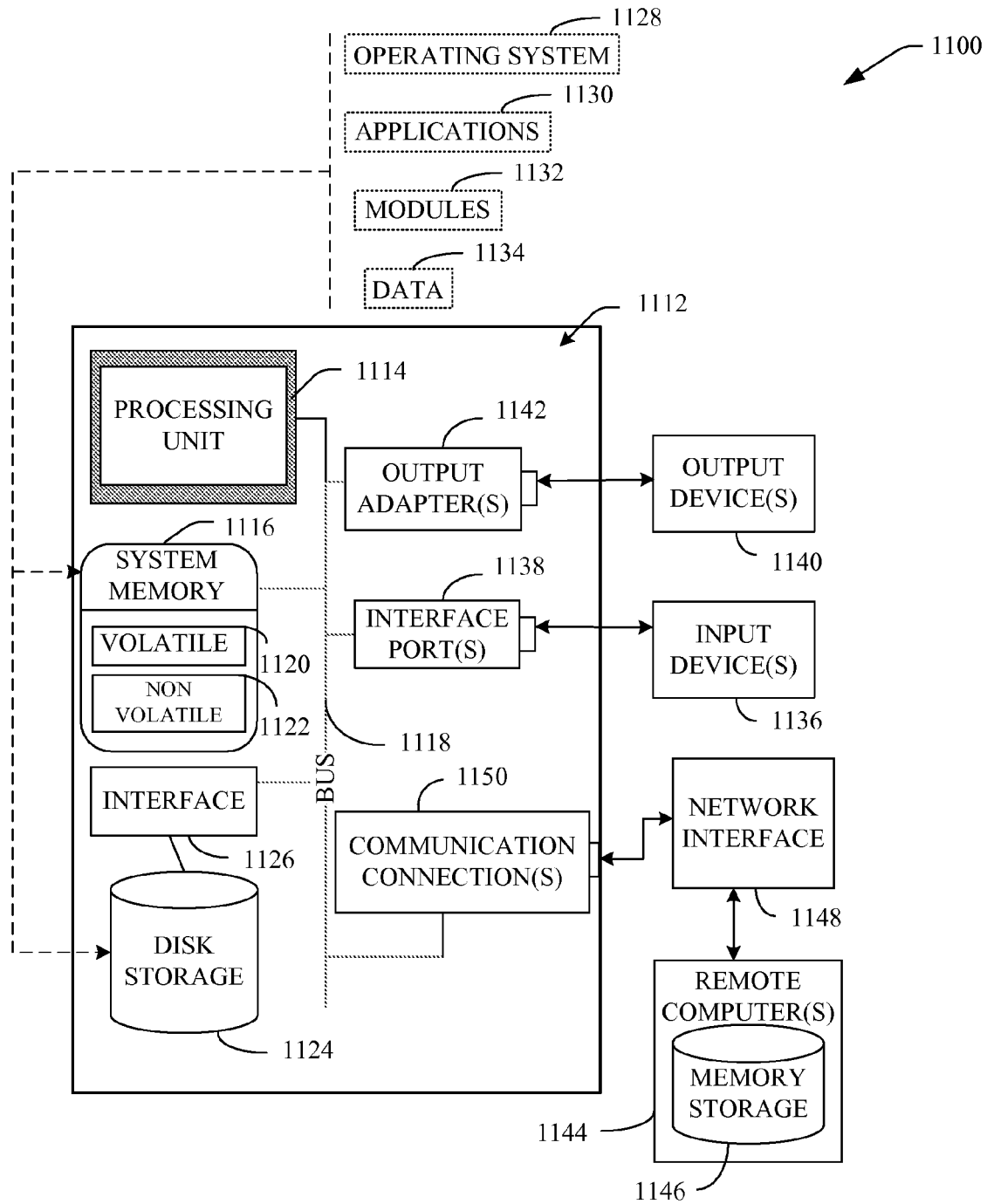
FIG. 11 is a schematic block diagram illustrating a suitable operating environment in which to simulate an SOC design.

In order to provide a context for the various aspects of the disclosed subject matter, FIGS. 10 and 11 as well as the following discussion are intended to provide a brief, general description of a suitable environment(s) in which the various aspects of the disclosed subject matter may be implemented. While the subject matter has been described above in the general context of computer-executable instructions of a computer program that runs on a computer and/or computers, those skilled in the art will recognize that the subject innovation also may be implemented in combination with other program modules. Generally, program modules include routines, programs, components, data structures, etc. that perform particular tasks and/or implement particular abstract data types. Moreover, those skilled in the art will appreciate that the inventive methods may be practiced with other computer system configurations, including single-processor or multiprocessor computer systems, mini-computing devices, mainframe computers, as well as personal computers, handheld computing devices (e.g., PDA, phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone computers. In a distributed computing environment, program modules may be located in both local and remote memory storage devices.

Referring to FIG. 10, illustrated is a block diagram of an exemplary, non-limiting electronic device 1000 that that can represent a finished design wherein one or more simulation memory components (e.g., simulation memory component 104 of FIG. 1, simulation memory component 104 of FIG. 2, simulation memory components 502 through 508 of FIG. 5) can be used for the verification and/or optimization of components associated with the electronic device 1000. The electronic device 1000 can be and/or can include, but is not limited to, network equipment (e.g., routers, access points), a media player and/or recorder (e.g., audio player and/or recorder, video player and/or recorder), a television, a smart card, a phone, a cellular phone, a smart phone, an electronic organizer, a PDAs, a portable email reader, a laptop computers, a digital camera, an electronic device associated with digital rights management, a Personal Computer Memory Card International Association (PCMCIA) card, a trusted platform module (TPM), a Hardware Security Module (HSM), a set-top box, a digital video recorder, a gaming console, a navigation system (e.g., global position satellite (GPS) system), secure memory devices with computational capabilities, a device with a tamper-resistant chip(s), an embedded computer in a machine (e.g., an airplane, a copier, a motor vehicle, a microwave oven), and the like.

Components of the electronic device 1000 can include, but are not limited to, a processor component 1002, a system memory 1004 (with nonvolatile memory 1006), and a system bus 1008 that can couple various system components including the system memory 1004 to the processor component 1002. The system bus 1008 can be any of several types of bus structures including a memory bus or memory controller, a peripheral bus, or a local bus using any of a variety of bus architectures.

Electronic device 1000 can typically include a variety of computer readable media. Computer readable media can be any available media that can be accessed by the electronic device 1000. By way of example, and not limitation, computer readable media can comprise computer storage media and communication media. Computer storage media includes volatile and non-volatile, removable and non-removable media implemented in any method or technology for storage of information such as computer readable instructions, data structures, program modules or other data. Computer storage media includes, but is not limited to, RAM, ROM, electrically erasable programmable ROM (EEPROM), nonvolatile memory 1006 or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by electronic device 1000. Communication media typically embodies computer readable instructions, data structures, program modules or other data in a modulated data signal such as a carrier wave or other transport mechanism and includes any information delivery media.

The system memory 1004 includes computer storage media in the form of volatile and/or nonvolatile memory such as nonvolatile memory 1006. A basic input/output system (BIOS), containing the basic routines that help to transfer information between elements within electronic device 1000, such as during start-up, can be stored in memory 1004. System memory 1004 typically also contains data and/or program modules that can be immediately accessible to and/or presently being operated on by processor component 1002. By way of example, and not limitation, system memory 1004 can also include an operating system, application programs, other program modules, and program data.

The nonvolatile memory 1006 can be removable or non-removable. For example, the nonvolatile memory 1006 can be in the form of a removable memory card (e.g., SD card, microSD card, SmartMedia) or a USB flash drive. It will be appreciated that, in one embodiment, the nonvolatile memory 1006 can comprise flash memory (e.g., single-bit flash memory, multi-bit flash memory). It is to be further appreciated that, in another embodiment(s), other types of nonvolatile memory, such as electrically erasable memory (e.g., EEPROM), can be utilized instead of or in addition to flash memory. In one embodiment of the disclosed subject matter, the nonvolatile memory 1006 can, for example, have the same or substantially same functionally as the memory component 302 as described in FIG. 3. In accordance with one aspect of the disclosed subject matter, the nonvolatile memory 1006 can be simulated, verified, and/or optimized at one point during the design process by using a simulation memory component (e.g., simulation memory component 104 of FIG. 1) as more fully described herein, for example, with regard to system 100, system 200, and system 300.

In one aspect, a user can enter commands and information into the electronic device 1000 through input devices (not shown) such as a keypad, microphone, tablet or touch screen although other input devices can also be utilized. These and other input devices can be connected to the processor component 1002 through input interface 1010 that can be connected to the system bus 1008. Other interface and bus structures, such as a parallel port, game port or a universal serial bus (USB) can also be utilized. A graphics subsystem (not shown) can also be connected to the system bus 1008. A display device (not shown) can be also connected to the system bus 1008 via an interface, such as output interface 1012, which can in turn communicate with video memory. In addition to a display, the electronic device 1000 can also include other peripheral output devices such as speakers (not shown), which can be connected through output interface 1012.

With reference to FIG. 11, a suitable environment 1100 for simulating and/or running verification on various aspects of the claimed subject is presented. The environment 1100 can include a computer 1112. The computer 1112 includes a processing unit 1114, a system memory 1116, and a system bus 1118. The system bus 1118 couples system components including, but not limited to, the system memory 1116 to the processing unit 1114. The processing unit 1114 can be any of various available processors. Dual microprocessors and other multiprocessor architectures also can be employed as the processing unit 1114.

The system bus 1118 can be any of several types of bus structure(s) including the memory bus or memory controller, a peripheral bus or external bus, and/or a local bus using any variety of available bus architectures including, but not limited to, Open NAND Flash Interface, Compact Flash Interface, Multimedia Card (MMC), Secure Digital (SD), CE-ATA, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1116 includes volatile memory 1120 and nonvolatile memory 1122. The basic input/output system (BIOS), containing the basic routines to transfer information between elements within the computer 1112, such as during start-up, is stored in nonvolatile memory 1122. By way of illustration, and not limitation, nonvolatile memory 1122 can include ROM, PROM, EPROM, EEPROM, or flash memory. Volatile memory 1120 includes RAM, which acts as external cache memory. By way of illustration and not limitation, RAM is available in many forms such as SRAM, dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM).

Computer 1112 also includes removable/non-removable, volatile/non-volatile computer storage media. FIG. 11 illustrates, for example, a disk storage 1124. Disk storage 1124 includes, but is not limited to, devices like a magnetic disk drive, floppy disk drive, tape drive, Jaz drive, Zip drive, LS-100 drive, flash memory card, or memory stick. The disk storage 124 can, for example, hold the expected values used during a simulation or verification and/or optimization of a design (e.g., system component 102 of FIG. 1, system component 102 of FIG. 4, system component 102 of FIG. 5). In addition, disk storage 1124 can include storage media (e.g., expected values of simulation memory components 502 through 508, processor component 512, memory device 514, cryptographic component 516, and/or authentication component 518 of FIG. 5 during verification of system component 102) separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1124 to the system bus 1118, a removable or non-removable interface is typically used, such as interface 1126.

It is to be appreciated that FIG. 11 describes software that acts as an intermediary between users and the basic computer resources described in the suitable operating environment 1100. Such software includes an operating system 1128. Operating system 1128, which can be stored on disk storage 1124, acts to control and allocate resources of the computer system 1112. System applications 1130 take advantage of the management of resources by operating system 1128 through program modules 1132 and program data 1134 stored either in system memory 1116 or on disk storage 1124. The applications 1130 can for example, be software programs used to simulation and verify a design (e.g., system component 102 of FIG. 1, system component 102 of FIG. 4, system component 102 of FIG. 5). It is to be appreciated that the disclosed subject matter can be implemented with various operating systems or combinations of operating systems.

A user enters commands or information into the computer 1112 through input device(s) 1136. Input devices 1136 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1114 through the system bus 1118 via interface port(s) 1138. Interface port(s) 1138 include, for example, a serial port, a parallel port, a game port, and a universal serial bus (USB). Output device(s) 1140 use some of the same type of ports as input device(s) 1136. Thus, for example, a USB port may be used to provide input to computer 1112, and to output information from computer 1112 to an output device 1140. Output adapter 1142 is provided to illustrate that there are some output devices 1140 like monitors, speakers, and printers, among other output devices 1140, which require special adapters. The output adapters 1142 include, by way of illustration and not limitation, video and sound cards that provide a means of connection between the output device 1140 and the system bus 1118. It should be noted that other devices and/or systems of devices provide both input and output capabilities such as remote computer(s) 1144.

Computer 1112 can operate in a networked environment using logical connections to one or more remote computers, such as remote computer(s) 1144. For example, the applications 130 can be a verification program that facilitates the verification and/or optimization of a design (e.g., system component 102 of FIG. 5) on at least one remote computer(s) 1144. The remote computer(s) 1144 can be a personal computer, a server, a router, a network PC, a workstation, a microprocessor based appliance, a peer device or other common network node and the like, and typically includes many or all of the elements described relative to computer 1112. For purposes of brevity, only a memory storage device 1146 is illustrated with remote computer(s) 1144. Remote computer(s) 1144 is logically connected to computer 1112 through a network interface 1148 and then physically connected via communication connection 1150. Network interface 1148 encompasses wire and/or wireless communication networks such as local-area networks (LAN) and wide-area networks (WAN). LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1150 refers to the hardware/software employed to connect the network interface 1148 to the bus 1118. While communication connection 1150 is shown for illustrative clarity inside computer 1112, it can also be external to computer 1112. The hardware/software necessary for connection to the network interface 1148 includes, for exemplary purposes only, internal and external technologies such as, modems including regular telephone grade modems, cable modems and DSL modems, ISDN adapters, and Ethernet cards.

What has been described above includes examples of aspects of the disclosed subject matter. It is, of course, not possible to describe every conceivable combination of components or methodologies for purposes of describing the disclosed subject matter, but one of ordinary skill in the art may recognize that many further combinations and permutations of the disclosed subject matter are possible. Accordingly, the disclosed subject matter is intended to embrace all such alterations, modifications and variations that fall within the spirit and scope of the appended claims. Furthermore, to the extent that the terms "includes," "has," or "having," or variations thereof, are used in either the detailed description or the claims, such terms are intended to be inclusive in a manner similar to the term "comprising" as "comprising" is interpreted when employed as a transitional word in a claim.

What is claimed is:

1. A system that facilitates design of a data transmission system, comprising:
   an integrated circuit chip having a first subset of processing components or memory components of the data transmission system physically formed into the integrated circuit chip;
   at least one simulation memory component that simulates a second subset of processing components or memory components of the data transmission system that are not physically formed into the integrated circuit chip, to facilitate simulation, verification or optimization, or a combination thereof, of a larger subset of the data transmission system than is physically formed into the integrated circuit chip; and
   a communication architecture that facilitates data transfer associated with the data transmission system between the at least one simulation memory component and the at least one of the first subset of processing components or memory components.

2. The system of claim 1, wherein the at least one simulation memory component substitutes the simulated second subset of processing components or memory components for at least one memory component of the data transmission system during the simulation, verification, or optimization, or the combination thereof, of the larger subset of the data transmission system.

3. The system of claim 1, wherein the simulation memory component substitutes the simulated second subset of processing components or memory components for at least one hardware component of the data transmission system during the simulation, verification, or optimization, or the combination thereof, of the larger subset of the data transmission system.

4. The system of claim 3, wherein the simulation memory component mimics at least one register or at least one internal memory component associated with the at least one hardware component.

5. The system of claim 1, the at least one simulation memory component further comprising:
   a depth component, wherein the depth component determines the number of memory locations that are associated with the simulation memory component; and
   a width component, wherein the width component determines the bit width of the at least one simulation memory component.

6. The system of claim 5, wherein the at least one simulation memory component is a memory model created based in part on Verilog, VHSIC (Very High Speed Integrated Circuit) Hardware Description Language (VHDL), SystemVerilog, Vera, or SystemC, or a combination thereof.

7. The system of claim 1, wherein the at least one simulation memory component replaces at least one of an authentication component, a cryptographic component, or a processor component, or a combination thereof, of the data transmission system during the simulation, verification, or optimization, or the combination thereof, of the data transmission system.

8. The system of claim 1, further comprising at least one first-in-first-out (FIFO) wrapper component, wherein the at least one first-in-first-out (FIFO) wrapper component adds first-in-first-out FIFO functionality to the at least one simulation memory component.

9. The system of claim 8, the simulation memory component further comprising:
   a depth component associated with the at least one simulation memory component, wherein the depth component determines a specified number memory locations that are associated with the at least one simulation memory component; and
   a width component associated with the at least one simulation memory component, wherein the width component determines the bit width of the at least on simulation memory component.

10. The system of claim 1, wherein the at least one simulation memory component replaces at least one of a flash memory, a mask-programmed read-only memory (ROM), a programmable ROM (PROM), an Erasable PROM (EPROM), an UltraViolet (UV)-erase EPROM, an one-time programmable ROM, an electrically erasable PROM (EEPROM), a random access memory (RAM), a static random access memory (SRAM), a dynamic random access memory (DRAM), or a combination thereof, of the data transmission system, during at least one of the simulation, verification, or optimization, or the combination thereof, of the data transmission system.

11. The system of claim 1, wherein the at least one simulation memory component is at least one of simulated, verified, or optimized, or a combination thereof, using one or more computers.

12. The system of claim 1, wherein the integrated circuit chip is physically integrated into an electronic device.

13. A method that facilitates designing a data transmission system, comprising:

installing at least one simulation memory component into a system component for replicating a sub-component of the system component, wherein the system component includes at least one hardware component related to the data transmission system; and at least one of simulating, verifying, or optimizing, or a combination thereof, combined operation of the system component and the replicated sub-component.

14. The method of claim 13, further comprising installing a plurality of simulation memory components into the system component for replicating a respective plurality of sub-components of the system component that form respective parts of a design of the data transmission system, wherein simulating, verifying or optimizing, or the combination thereof, is performed with respect to the combined operation of physical sub-components of the design, that are physically formed into a system-on-chip that comprises the system component, and each of the plurality of replicated sub-components of the design.

15. The method of claim 13, further comprising:
installing the at least one simulation memory component in place of at least one of a memory component or a first-in-first-out (FIFO), or a combination thereof, associated within the system component;
simulating the system component in conjunction with the at least one simulation memory component;
measuring data throughput based in part on predefined throughput criteria;
adjusting the width associated with the at least one simulation memory component based in part on the measured data throughput and the predefined throughput criteria, if the width does not meet the predefined throughput criteria; and
adjusting the depth of the at least one simulation memory component, based in part on the measured data throughput and the predefined throughput criteria, if the width does not meet the predefined throughput criteria.

16. The method of claim 15, wherein the predefined throughput criteria is a data throughput requirement associated with the at least one memory component in which the at least one simulation memory component replaces during simulation of the system component, a throughput requirement of the system component as a whole, or a combination thereof.

17. The method of claim 13, further comprising, creating at least one FIFO wrapper for the at least one simulation memory component for simulating at least one FIFO with the system component.

18. The method of claim 13, further comprising:
installing a bus architecture to the system component;
installing intellectual property components to the bus architecture;
installing completed components associated with the system component to the bus architecture; and
simulating the system component with the components associated with the bus architecture installed in the system component.

19. The method of claim 18, further comprising verifying the system component with the components associated with the bus architecture installed in the system component to ensure overall connectivity integrity within the system component.

20. An apparatus that facilitates design of an electronic system having a set of integrated circuit chips, comprising:
a communication bus for exchanging signals between respective ones of the set of integrated circuit chips of the electronic system and the apparatus;
a subset of the integrated circuit chips removably connected to the apparatus and to the communication bus such that respective integrated circuit chips of the subset interact with other respective integrated circuit chips of the subset and with the apparatus as designed for the electronic system; and
a simulation component that simulates at least one of the set of integrated circuit chips, the simulated set of integrated circuit chips is not removably connected to the apparatus, wherein the simulation component is configured to interact with the subset of the integrated circuit chips and with the apparatus in a manner designed for the at least one of the set of integrated circuit chips to interact with the electronic system.

* * * * *